(12) United States Patent
Zhang et al.

(10) Patent No.: US 6,605,246 B2
(45) Date of Patent: *Aug. 12, 2003

(54) FERROELECTRIC RELAXOR POLYMER METHOD

(75) Inventors: Qiming Zhang, State College, PA (US); Vivek Bharti, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/099,080

(22) Filed: Mar. 14, 2002

(65) Prior Publication Data

US 2002/0090517 A1 Jul. 11, 2002

Related U.S. Application Data (63) Continuation of application No. 09/195,061, filed on Nov. 18, 1998, now Pat. No. 6,423,412.
(60) Provisional application No. 60/065,641, filed on Nov. 18, 1997, and provisional application No. 60/093,718, filed on Jul. 22, 1998.

(51) Int. Cl.[7] .......................... B29B 11/14; B29B 13/08; B29C 55/00; B29C 35/08
(52) U.S. Cl. ...................... 264/461; 264/463; 264/479; 264/485; 264/488; 264/494; 264/119; 264/291
(58) Field of Search ................................ 264/109–128, 264/291, 460, 461, 463, 479, 488, 494, 485

(56) References Cited

U.S. PATENT DOCUMENTS 5,922,493 A * 7/1999 Humphrey et al. ......... 429/316
6,440,755 B1 * 8/2002 Ramotowski ................. 438/3

OTHER PUBLICATIONS

Ferroelectrics, 1990, vol. 109, pp. 303–308, F. Macchi et al. "Effect of Electron Irradiation on the Ferroelectric Transition of P (VDF–TrFE) Copolymers".

Macromolecules 1985, vol. 18, pp. 910–918, Andrew J. Lovinger, "Polymorphic Transformations in Ferroelectric Copolymers of Vinylidene Fluoride Induced by Electron Irradiation".

Nuclear Instruments and Methods in Physics Research, B46 (1990), pp. 334–337, F. Macchi et al., "Micromechanical Properties of Electron Irradiated PVDF–TrFE Copolymers".

* cited by examiner

Primary Examiner—Stephen J. Lechert, Jr.
(74) Attorney, Agent, or Firm—Ohlandt, Greeley, Ruggiero & Perle, L.L.P.

(57) ABSTRACT

The invention is embodied in an electrical device which includes at least a layer of a ferroelectric polyvinylidine flouride polymer that has been processed to exhibit an electrostrictive strain of 4% or more when an electric field gradient of 50 megavolts per meter or greater is applied thereacross. The processing of the polymer preferably involves subjecting it to either electron beam radiation or gamma radiation. The polyvinylidine flouride polymer is selected from the group of: polyvinylidine fluoride, polyvinylidine fluoride-trifluoroethylene P(VDF-TrFE), polyvinylidine fluoride tetrafluoroethylene P(VDF-TFE), polyvinylidine fluoride trifluoroethylene-hexafluoropropylene P(VDF-TFE-HFE) and polyvinylidine fluoride-hexafluoropropylene P(VDF-HFE).

6 Claims, 11 Drawing Sheets

TABLE 1: COMPARISON OF STRAIN ENERGY DENSITIES

| MATERIALS | | Y(GPa) | S (%) | Ys²/2(J/cm³) | Ys²/2ρ(J/kg) |
|---|---|---|---|---|---|
| ELECTROSTRICTIVE | S. | 0.40 | 4.5 | 0.4 | 200 |
| PVDF-TrFE | S. | 1.3 | 3.5 | 0.8 | 400 |
| PIEZOCERAMICS | | 64 | 0.2 | 0.13 | 17 |
| MAGNETOSTRICTOR | | 100 | 0.2 | 0.2 | 21.6 |
| PZN-PT SINGLE CRYSTAL | | 7.7 | 1.7 | 1.0 | 131 |
| POLYURETHANE | | 0.017 | 11 | 0.1 | 83 |

FIG. 7a

TABLE 2: PVDF-TrFE STRETCHED SAMPLES IRRADIATED UNDER NITROGEN ATMOSPHERE

| FIELD APPLIED = 150 MV/m | | ABSORBED DOSE (Mrad) | | | | | | |
|---|---|---|---|---|---|---|---|---|
| | | 0 | 40 | 60 | 80 | 100 | 120 | 142.5 |
| 50/50 IRRADIATED AT 77°C | P,(mC/m²) | 130.00 | – | 56.00 | 43.50 | 35.50 | 28.00 | – |
| | P,(mC/m²) | 113.26 | – | 4.18 | 2.87 | 2.55 | 2.56 | – |
| | E,(mV/m) | 54.11 | – | 8.18 | 8.01 | 9.84 | 13.26 | – |
| 50/50 IRRADIATED AT 95°C | P,(mC/m²) | 130.00 | 63.00 | 53.00 | 41.00 | 32.00 | – | – |
| | P,(mC/m²) | 113.26 | 54.11 | 3.54 | 2.61 | 3.98 | – | – |
| | E,(mV/m) | 54.11 | 9.72 | 7.35 | 7.99 | 17.71 | – | – |
| 65/35 IRRADIATED AT 77°C | P,(mC/m²) | 134.00 | – | – | 87.00 | 56.00 | 50.00 | 45.5 |
| | P,(mC/m²) | 117.57 | – | – | 13.18 | 3.96 | 2.79 | 4.0 |
| | E,(mV/m) | 53.61 | – | – | 16.91 | 9.64 | 7.53 | 12.33 |
| 65/35 IRRADIATED AT 95°C | P,(mC/m²) | 134.00 | – | 88.00 | 60.00 | 64.00 | 54.00 | – |
| | P,(mC/m²) | 117.57 | – | 18.59 | 3.91 | 6.54 | 6.13 | – |
| | E,(mV/m) | 53.61 | – | 18.70 | 8.55 | 12.69 | 13.98 | – |

FIG. 7b

TABLE 3: EFFECT OF IRRADIATION PARAMETERS ON UNSTRETCHED P(VDF-TrFE) COPOLYMER FILMS

| FIELD APPLIED=150 MV/m | | ABSORBED DOSE (Mrad) | | | | | | | | | | | | |
|---|---|---|---|---|---|---|---|---|---|---|---|---|---|---|
| | | 0 | 30 | 40 | 60 | 80 | 90 | 100 | 110 | 120 | 125 | 142.5 | 150 | 175 |
| 50/50 IRRADIATED AT 25°C | $P_r(mC/m^2)$ | 87.0 | | | 55 | | | 62.5 | | 45 | | | | |
| | $P_r(mC/m^2)$ | 64.4 | | | 3.94 | | | 3.0 | | 3.1 | | | | |
| | $E_c(mV/m)$ | 44.8 | | | 7.2 | | | 5.2 | | 8.1 | | | | |
| 50/50 IRRADIATED AT 95°C | $P_r(mC/m^2)$ | 87.0 | | 52.5 | 47 | 35 | | | | | | | | |
| | $P_r(mC/m^2)$ | 64.4 | | 5.43 | 4.75 | 2.34 | | | | | | | | |
| | $E_c(mV/m)$ | 44.8 | | 10.54 | 10.89 | 8.36 | | | | | | | | |
| 50/50 IRRADIATED AT 120°C | $P_r(mC/m^2)$ | 87.0 | 62.5 | 54.0 | 47.5 | 33 | – | 31.5 | – | | | | 20 | |
| | $P_r(mC/m^2)$ | 64.4 | 7.51 | 3.4 | 4.90 | 3.94 | – | 3.10 | – | | | | 2.42 | |
| | $E_c(mV/m)$ | 44.8 | 11.2 | 5.9 | 10.45 | 17.54 | – | 13.59 | – | | | | 17.36 | |
| 65/35 IRRADIATED AT 25°C | $P_r(mC/m^2)$ | 105.0 | | | | 64 | | | | | 65 | | | 35 |
| | $P_r(mC/m^2)$ | 86.38 | | | | 4.3 | | | | | 5.3 | | | 1.98 |
| | $E_c(mV/m)$ | 55.41 | | | | 8.1 | | | | | 8.2 | | | 5.7 |
| 65/35 IRRADIATED AT 77°C | $P_r(mC/m^2)$ | 105.0 | – | – | – | 57.00 | | 50.00 | | 46.5 | – | 40.00 | – | |
| | $P_r(mC/m^2)$ | 86.38 | – | – | – | 6.23 | | 4.32 | | 3.38 | – | 3.41 | – | |
| | $E_c(mV/m)$ | 55.41 | – | – | – | 13.14 | | 10.17 | | 8.95 | – | 10.64 | – | |
| 65/35 IRRADIATED AT 95°C | $P_r(mC/m^2)$ | 105.0 | – | – | 62.00 | 60.00 | | 53.00 | | – | – | – | – | – |
| | $P_r(mC/m^2)$ | 86.38 | – | – | 4.00 | 5.56 | | 6.05 | | – | – | – | – | – |
| | $E_c(mV/m)$ | 55.41 | – | – | 7.00 | 10.78 | | 13.24 | | – | – | – | – | – |
| 65/35 IRRADIATED AT 120°C AR. ATMOSPH. | $P_r(mC/m^2)$ | 105.0 | – | 100.0 | 66.00 | 50.00 | | 27.50 | | – | – | – | – | – |
| | $P_r(mC/m^2)$ | 86.38 | – | 58.03 | 7.77 | 3.52 | | 3.38 | | – | – | – | – | – |
| | $E_c(mV/m)$ | 55.41 | – | 29.52 | 11.37 | 7.77 | | 17.55 | | – | – | – | – | – |
| 65/35 SOLUTION CAST IRRADIATED AT 120°C | $P_r(mC/m^2)$ | 94.00 | 72.0 | – | 75.00 | 62.50 | | 46.00 | | – | 32.50 | – | 20.50 | 20 |
| | $P_r(mC/m^2)$ | 71.22 | 41.8 | – | 17.04 | 7.86 | | 7.41 | | – | 3.69 | – | 2.01 | 2.13 |
| | $E_c(mV/m)$ | 55.84 | 33.2 | – | 17.55 | 13.22 | | 17.84 | | – | 16.18 | – | 15.46 | 16.3 |
| 72/28 IRRADIATED AT 120°C | $P_r(mC/m^2)$ | 100 | | – | 95 | | | 47 | | | – | 87.0 | 27.5 | |
| | $P_r(mC/m^2)$ | 80.64 | – | – | 54.26 | | | 14.53 | | | – | 64.4 | 2.83 | |
| | $E_c(mV/m)$ | 57.38 | – | – | 37.75 | | | 30.79 | | | – | 44.8 | 16.23 | |
| 72/28 SOLUTION CAST AT 120°C | $P_r(mC/m)$ | 100 | – | – | 80 | | | 44 | | | – | – | 44 | |
| | $P_r(mC/m^2)$ | 80.64 | – | – | 45.84 | | | 13.96 | | | – | – | 14.93 | |
| | $E_c(mV/m)$ | 57.38 | – | – | 39.98 | | | 35.25 | | | – | – | 34.53 | |

FERROELECTRIC RELAXOR POLYMER METHOD

This is a continuation of application Ser. No. 09/195,061, filed Nov. 18, 1998, now U.S. Pat. No. 6,423,412. This Application claims priority from U.S. Provisional Application Ser. No. 60/065,641, filed Nov. 18, 1997, and Provisional Application Ser. No. 60/093,718, filed Jul. 22, 1998.

The United States Government has certain rights to the invention that is the subject of this application as a result of the development thereof under Contract No. N00014-97-1-0900.

FIELD OF THE INVENTION

This invention relates to ferroelectric polymers and, more particularly, to relaxor ferroelectric polymers that have been processed to exhibit high electrostrictive strain levels.

BACKGROUND OF THE INVENTION

Ferroelectric polymers have attracted interest for many years as they reveal a new aspect of polymers for use as functional materials. Such polymers have been recognized for their potential uses in a variety of large area transducer, actuator and sensor applications because of their flexibility, mechanical strength, light weight, easy processibility into large area films and ability to be arranged into desirable configurations. By contrast, existing functional materials, such as ceramics, are brittle, heavy and difficult to produce into large area configurations.

In spite of their advantages over the ceramics, current polymers suffer low field sensitivities, such as dielectric constant, piezoelectric coefficient, electromechanical coupling factor and field induced strain. These constraints severely limit the application of ferroelectric polymers as transducers, sensors and actuators.

There is a demand for improved materials for use in actuators and transducers due to the limitations of currently available materials. For example, current actuator materials, such as electrostatic, electromagnetic and piezoelectric materials, exhibit limitations in one or more of the following performance parameters: strain, elastic energy density, speed of response and efficiency. For instance, piezoceramic and magnetostrictive materials, while possessing low hysteresis and high response speeds, suffer from low strain levels (~0.1%). Shape memory alloys generate high strain and high force but are often associated with large hysteresis and very slow response speeds. On the other hand, there are several polymers such as polyurethane, polybutadine etc. which can generate high electric field induced strain i.e. up to 6–11%. But, due to their low elastic modulus, their elastic energy density is very low. Further, the strain generated in these materials is mainly due to the electrostatic effect, which is a low frequency process. Use of these materials at high frequencies reduces their response drastically. In addition, due to their low dielectric constant, the electric energy density and electromechanical coupling coefficient of these polymers is very low which is an undesirable characteristic for many transducer and actuator applications.

Substantial efforts have been devoted to improvement of phase switching materials where an antiferroelectric and ferroelectric phase change can be field induced to cause a high strain in the material. While strains higher than 0.7% have been achieved in such materials, due to the brittleness of ceramics, severe fatigue has been found to occur at high strain levels. Recently, in a single crystal ferroelectric relaxor, i.e., PZN-PT, an electric field strain of about 1.7%, with very little hysteresis, has been reported, which is exceptionally high for an inorganic materials (see: Park and Shrout, J Appl. Phys., 82, 1804 (1997)). In such ceramic materials, mechanical fatigue occurs at high strain levels, a major obstacle limiting their use for many applications.

For many applications, such as microrobots, artificial muscles, vibration controllers, etc., higher strain levels and higher energy densities are required. Thus, there is a need for a general purpose electroactive material with improved performance for use with transducer and actuators.

There is a further requirement for improved ultrasonic transducers and sensors for use in medical imaging applications and low frequency acoustic transducers. Current piezoceramic transducer materials, such as PZTs, have a large acoustic impedance (Z>35 Mrayls) mismatch with the air and human tissue (Z<2 Mrayls). On the other hand, piezoelectric polymers such as P(VDF-TrFE), PVDF not only have an acoustic impedance well matched (Z<4 Mrayls) to human tissue but also offer a broad nonresonant frequency bandwidth. But, because of their low piezoelectric activity and low coupling coefficient, the sensitivity of such ultrasonic polymer transducers is very low.

The capacitor industry also requires a capacitor which has a much higher electric energy density than is currently available. Current dielectric materials, such as polymers, have a low dielectric constant (~2–10) and limited energy density. In addition, with current ceramics, the maximum field which can be applied is limited.

Accordingly, it is an object of the invention to provide a polymeric material which can generate a high electric field—induced strain with little hysteresis.

It is another object of the invention to provide a polymeric material which exhibits a high elastic energy density.

It is a further object of the invention to provide a polymer in which the direction of induced strain can be tuned by means of alteration of the ratio of transverse strain ($S_1$) to longitudinal strain ($S_3$).

It is yet another object of the invention to provide a polymeric material that exhibits a room temperature dielectric constant that is higher than other currently available polymers.

It is a further object of the invention to provide a polymer which exhibits relaxor ferroelectric behavior and hence has a slim polarization hysteresis loop, which, coupled with high electric field breakdown strength, can provide a capacitor with high electric energy density.

SUMMARY OF THE INVENTION

The invention is embodied in an electrical device which includes at least a layer of a ferroelectric polyvinylidine flouride polymer that has been processed to exhibit an electrostrictive strain of 4% or more when an electric field strength of 50 megavolts per meter or greater is applied thereacross. The processing of the polymer preferably involves subjecting it to either electron beam radiation or gamma radiation. The polyvinylidine flouride polymer is selected from the group of: polyvinylidine flouride, polyvinylidine flouride-trifluoroethylene P(VDF-TrFE), polyvinylidine tetrafluoroethylene P(VDF-TFE), polyvinylidine trifluoroethylene hexafluoropropylene P(VDF-TFE-HFE) and polyvinylidine hexafluoropropylene P(VDF-HFE).

BRIEF DESCRIPTION OF THE DRAWINGS

FIG. 1 is a plot of polarization P versus electric field E showing polarization hysteresis loops of P(VDF-TrFE)

50/50 copolymer measured at room temperature: (a) before irradiation and (b) Irradiation with 40 Mrad at 120 C.

DETAILED DESCRIPTION OF THE INVENTION

In ferroelectric polymers such as P(VDF-TrFE), it has been found during structural investigations that large lattice strains and large changes in dimensions are produced when a phase transformation from ferroelectric phase to paraelectric phase occurs. See: T. Furukawa, Phase Transition, 18, 143 (1989); K. Tashiro et al.

It has been observed by others in studies of polyvinylidine fluoride-tri-fluoroethylene P(VDF-TrFE) copolymers, that high energy irradiation can convert the ferroelectric phase into a paraelectric phase. See A. J. Lovinger, Macromolecules, 18, 910 (1985) and F. Macchi et al., Nucl. Instr. and Methods in Phys. Res., B46, 324 (1990); Ferroelectrics, 109, 303 (1990). Macchi et. al. observed changes in dielectric constant, elastic properties and thermal expansion after irradiation and correlated their results to changes in crystallinity. Ferroelectrics, 57, 297 (1984); T. Yamada et al., J. Appl. Phys., 52, 948 (1981); and A. J. Lovinger et al., Polymer, 28, 617 (1987).

In addition, due to the presence of the crystalline phase, the Young's modulus of these polymers is very high and offers high force levels and high energy densities. These results demonstrate that ferroelectric polymers can provide an effective coupling between an applied electric field and a resultant strain response.

However, a problem exists in utilizing the strain associated with phase transformation in existing ferroelectric polymers. In particular, the problem is that the transition is very sharp and occurs at high temperatures. Further, the transition exhibits a large hysteresis.

The information developed by Macchi et al. and Lovinger served as a foundation for Applicants' study that led to this invention. Applicants examined the effects of irradiation on the field induced strain level, the elastic energy density and degree of hysteresis by (i) change of irradiation parameters (such as irradiation dose and temperature), (ii) use of different sample processing techniques (such as melt pressing and solution casting using different solvents, annealing temperature and time) and (iii) use of different mol %'s of P(VDF-TrFE) copolymer. All irradiation of polymers was carried out in inert atmospheres, e.g., nitrogen or argon, to prevent oxidation of the samples.

It was found that under certain sample treatment conditions (irradiation dose, irradiation temperature, film preparation methods etc.), an ultra high electrostrictive strain and a high elastic energy density can be obtained. Tested polymers can withstand an electric field higher than 350 MV/m, resulting in very high elastic energy densities. It was also found that the phase which was transformed after electron irradiation is not a simple paraelectric phase, but a relaxor ferroelectric which has local micropolar regions.

Applicants were able to modify the structure of ferroelectric polymers so that use could be made of the strains associated with phase transition at room temperature and to either reduce or eliminate the hysteresis losses, without reducing the strain levels. It was found that this was possible if the macroscopic coherent polarization domains could be broken up and inhomogeneities/defects introduced into the crystal structure, i.e., conversion of part of the trans molecular bonds to gauche molecular bonds.

There are several ways by which these effects can be accomplished, i.e., chemically, by adding a bulky side group to the main polymer chain which operates as an internal plasticizer; and by irradiation, i.e., by introducing defects using high energy radiation (e.g. at energy levels in an approximate range of 500 KeV to 3 MeV) using beta or gamma rays in an oxygen free atmosphere. The radiation, in addition to inducing defects in the molecular structures, also enabled crosslinking to occur.

In addition to P(VDF-TrFE), it is clear that additional polyvinylidine flouride polymers such as polyvinylidine flouride tetrafluoroethylene P(VDF-TFE), polyvinylidine flouride trifluoroethylene-hexafluoropropylene P(VDF-TFE-HFE), polyvinylidine flouride-hexafluoropropylene P(VDF-HFE) etc., can be processed to exhibit very high field-induced strains. Hereafter, the term "PVDF" will be used to collectively refer to the aforementioned homopolymer and copolymers.

Using radiation to introduce defects into the polymeric materials, it was found that energy levels in the approximate range of 500 KeV to 3 MeV were usable, although energy levels higher than 500 KeV were preferred. The radiation sources were preferably electron beams, and gamma rays from suitable radioactive species (e.g., cobalt).

Further, it was found that both stretched and unstretched polymeric species exhibited high levels of induced strain, with stretched polymers modified in accord with the invention being preferred for actuator applications with actuation along the stretching direction and unstretched polymers, modified in accord with the invention, being preferred for capacitor applications (along the thickness direction).

Film Preparation and Irradiation Conditions:

Polyvinylidene fluoride-trifluoroethylene (P(VDF-TrFE)) copolymers were used during the experimental investigations described below, however it is to be understood that other polymers may be similarly processed to achieve similar results, as indicated above. Copolymer powders having PVDF(x)-TrFE(1−x), where x ranges from 50 to 86 mol %, were supplied by Solvay and Cie, Belgium. Polymer films were prepared by both melt pressing and solution casting methods. In case of melt pressed films, at first, the copolymer powder was pressed between two aluminum foil layers at temperatures between 180 C to 220 C and then cooled to room temperature, either by quenching the sandwich in ice cooled liquid or by slow cooling.

For solution cast films, the powder was dissolved either in N,N-dimethyl formamide (DMF) or methyl ethyl ketone (MEK) solutions. These solutions were poured onto an ultrasonically cleaned glass plate, placed in an oven and maintained at 30 C or 70 C for six hours, in case of MEK and DMF solutions, respectively. After slow evaporation of the solvents, uniform transparent films of P(VDF-TrFE) were formed.

Stretched films were prepared by uniaxially stretching the films up to five times their initial length, at temperatures between 25 C~50 C. In order to improve the crystallinity and to remove residual solvent in case of solution cast films, both unstretched and stretched films (under clamped conditions) were annealed in a vacuum oven at 140 C for 16 hours. The films were then irradiated in an oxygen free atmosphere (e.g., nitrogen or argon) with 2.5 MeV to 3 MeV electrons at different temperature ranges from 25 to 120 C. Several irradiation dosages in the range from 30 to 175 Mrad were used.

Figure 7A:
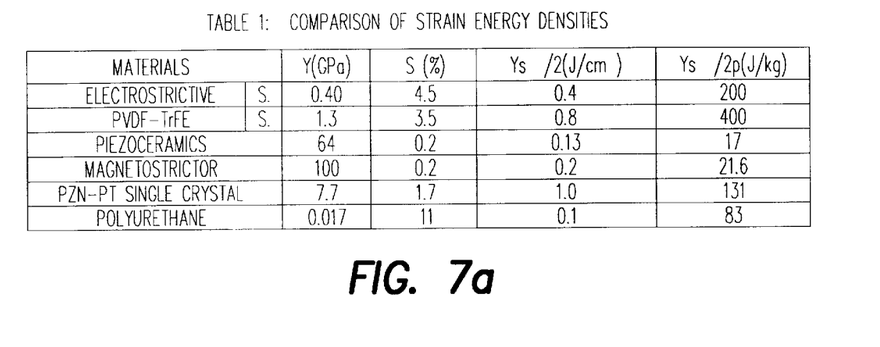
FIG. 7a incorporates Table 1 which indicates effects of irradiation parameters on unstretched P(VDF-TrFE) copolymer films.
Figure 7B:
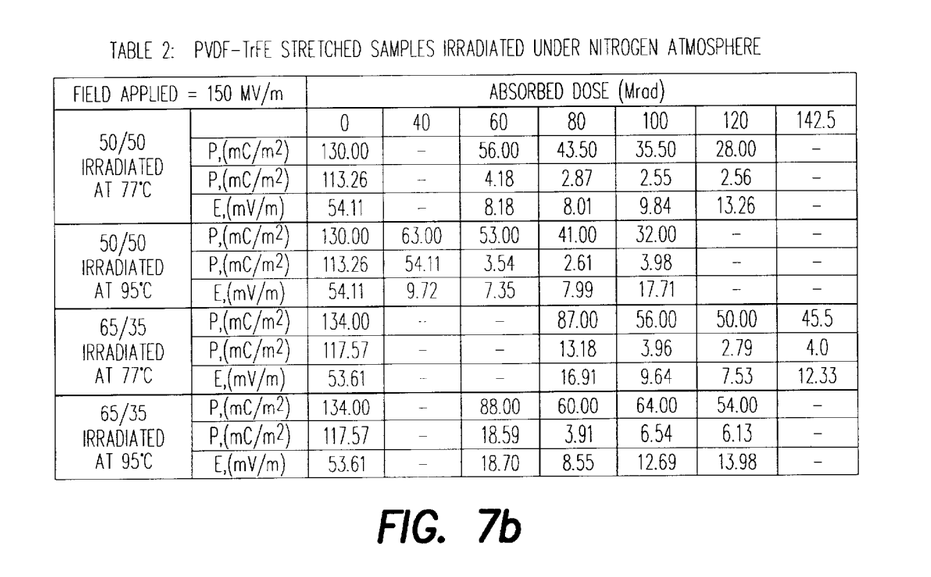
FIG. 7b incorporates Table 2 which indicates effects of irradiation parameters on stretched P(VDF-TrFE) copolymer films in a nitrogen atmosphere.
Figure 7C:
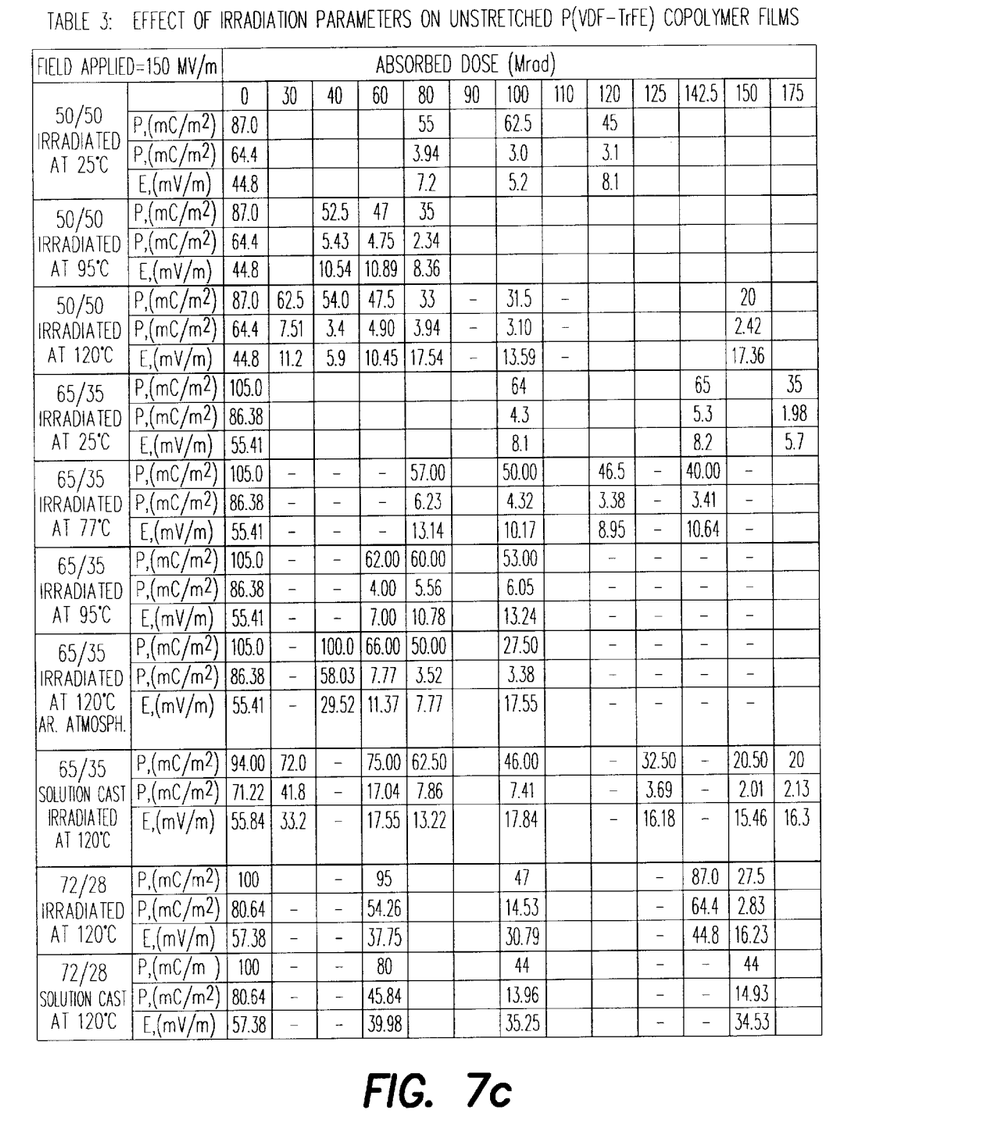
FIG. 7c incorporates Table 3 which compares strain and strain energy densities for a variety of materials.

Polarization Behavior:

It was found that irradiation parameters greatly affected the polymers' material properties. Thus, selection of irradiation condition was important to obtain a polymeric material with desired electrical properties. The changes in saturation polarization Ps, remnant polarization Pr and critical field Ec, observed from polarization hysteresis loops measured at room temperature, are shown in FIGS. 7b and 7c (Tables 2 and 3). Ps, Pr and Ec are saturation polarization, remnant polarization and critical field, respectively, observed from ferroelectric hysteresis loops measured at 150 MV/m electric field.

Figure 1:
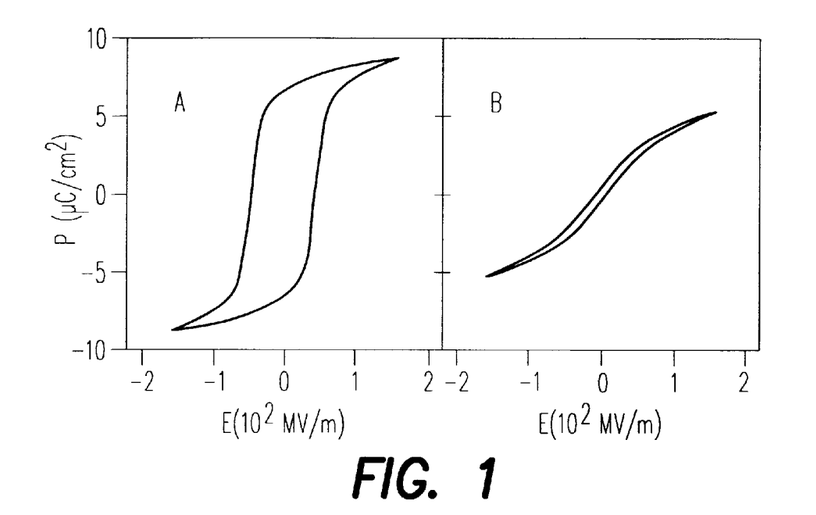

It was discovered that by irradiating the copolymer under proper irradiation conditions, the ferroelectric hysteresis was eliminated. This effect is shown in FIG. 1 which plots polarization P versus electric field E and shows polarization hysteresis loops of P(VDF-TrFE) 50/50 copolymer, measured at room temperature: (a) before irradiation and (b) after irradiation with 40 Mrad at 120 C.

Figure 2:
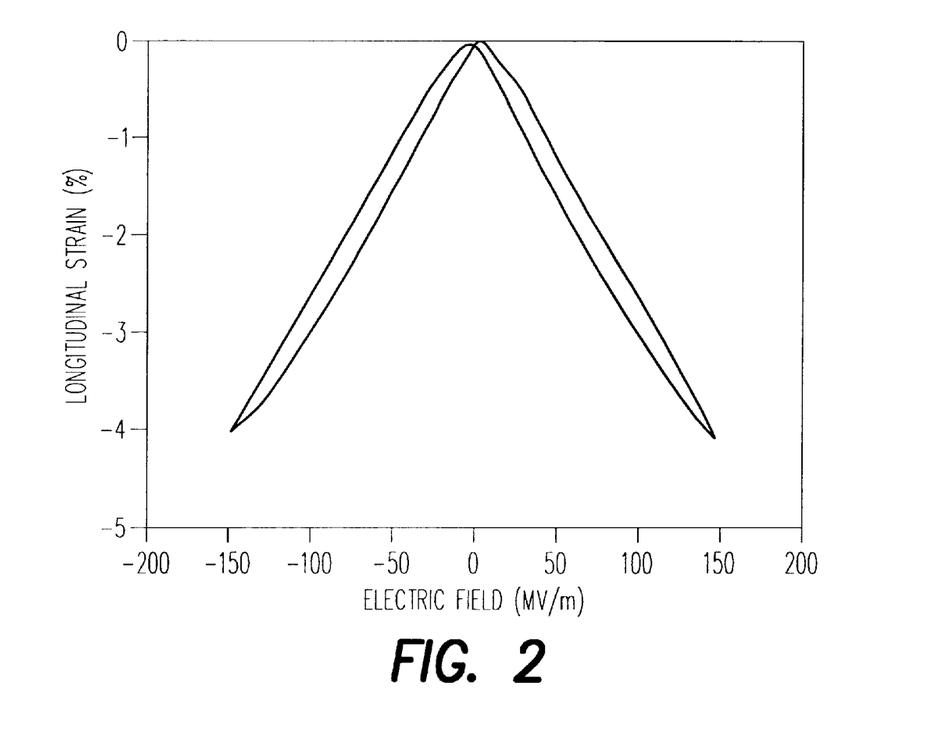
FIG. 2a is a plot of longitudinal strain versus applied electric field showing the field dependence of P(VDF-TrFE) 65/35 mol % unstretched copolymer film after irradiation at 120 C with 60 Mrad dose.
FIG. 2b is a plot of longitudinal strain versus applied electric field for P(VDF-TrFE) (50/50 mol %) unstretched film after irradiation at 120 C with 40 Mrad dose.
Figure 2B:
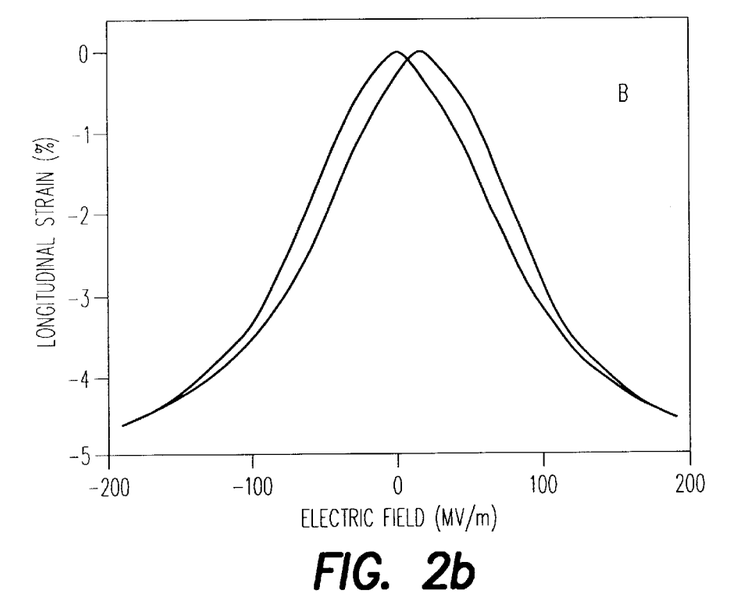
Figure 3:
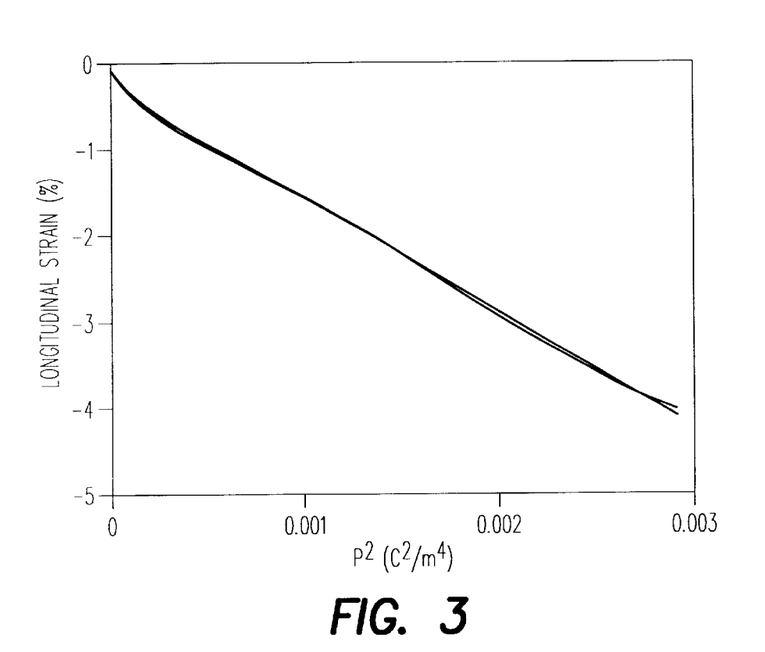
FIG. 3 is a plot of the electrostrictive relation between the strain and polarization shown in FIG. 2, where the strains at P>0 and P<0 regions are overlapped as a result of the dependence of P2 on the strain. The deviation of the data points from the straight line at S near zero is due to the zero point uncertainty of the measurement set-up.

Strain Data:

A large increase was observed in electric field-induced strain for both stretched and unstretched films along and perpendicular to the applied electric field (i.e., longitudinal strain S3 and transverse strain S1) (along the stretching direction in case of stretched films). FIG. 2b is a plot of longitudinal strain versus applied electric field for a P(VDF-TrFE) (50/50 mol %) unstretched film irradiated with 40 Mrad at 120 C. FIG. 2b is a plot of longitudinal strain versus applied electric field showing the field dependence of P(VDF-TrFE) 65/35 mol % unstretched copolymer film after irradiation at 120 C with 60 Mrad dose.

Figure 4A:
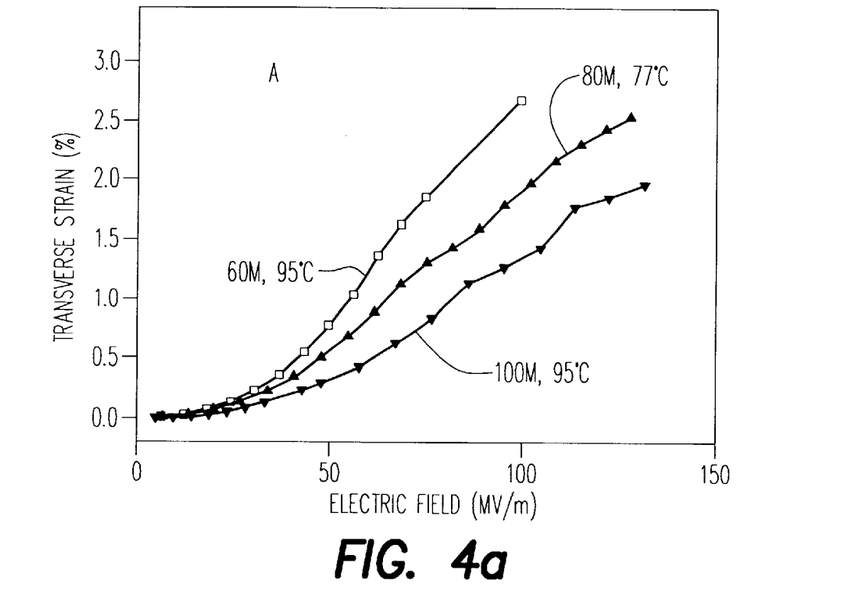
FIGS. 4a and 4b illustrate plots of strain versus electric field of P(VDF-TrFE) (65/35 mol %) copolymer films, where plot (B) shows longitudinal strain of stretched film treated the same as in (A). (A) shows transverse strain of stretched films irradiated at different temperatures with different doses.
Figure 4B:
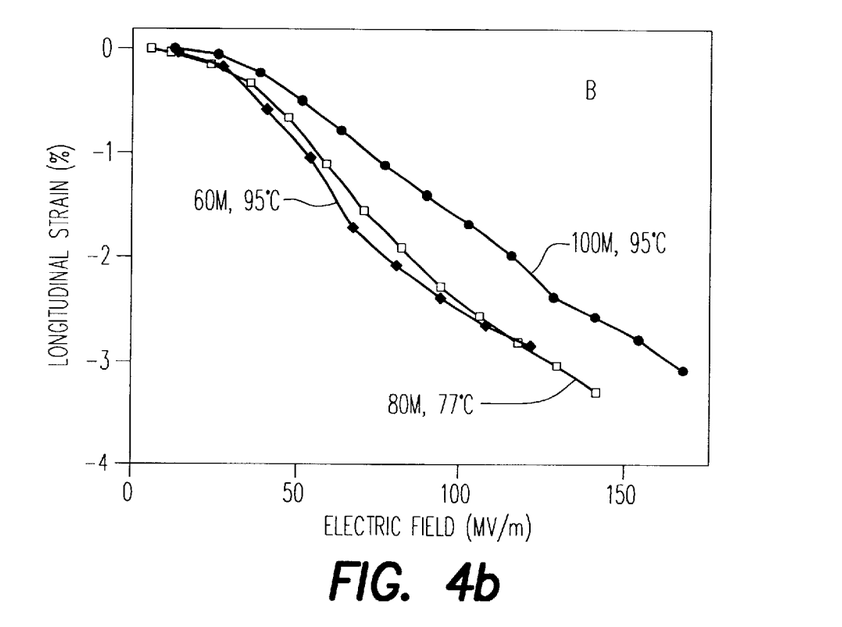

As there shown, the maximum longitudinal strain levels, 4% and 4.5% were observed at 150 and 190 MV/m for P(VDF-TrFE), 50/50 and 65/35 mol % unstretched films respectively. In addition, as shown in FIG. 4, the induced strain exhibited very low hysteresis and followed the electrostrictive relation, $S=QP2$ between strain (S) and applied electric filed (E). Q is an electrostrictive coefficient. The electrostrictive strain was reproducible under a cyclic electric field. The preferred molar percentages of the monomers in P(VDF-TrFE) are from about 30/70 mol % to about 75/25 mol %.

This attribute is an attractive feature for many transducer applications, for example, displacement transducers are used in optical communications to control optical path lengths with accuracy's on the order of a wavelength of light.

An outstanding characteristic of materials made according to the invention is that by modifying the polymer morphology (stretched vs unstretched) and controlling the irradiation parameters, the magnitude and direction of the transverse and longitudinal strain can be tuned.

For example, for stretched films, the transverse strain is 0.8 to 1.2 times the longitudinal strain. This is shown in FIG. 4 which illustrates plots of strain versus electric field of P(VDF-TrFE) (65/35 mol %) copolymer films, where plot (A) shows longitudinal strain of stretched and unstretched films irradiated at 120 C with different doses and plot (B) shows transverse strain of stretched films irradiated at different temperatures with different radiation.

In unstretched films, the transverse strain is about 0.2 to 0.4 times the longitudinal strain (with an opposite sign). This is shown in FIG. 5 which is a plot of strain versus electric field of P(VDF-TrFE) (65/35 mol %) unstretched films, irradiated at 120 C with 60 Mrad dose, showing that longitudinal strain ($S_3$) is three times higher than transverse strain ($S_1$).

However, strain measured perpendicular to the stretching and applied field direction is always smaller than the strain measured along the field direction (longitudinal strain, $S_3$) and the strain measured along the stretching direction (transverse strain, $S_1$).

Figure 5:
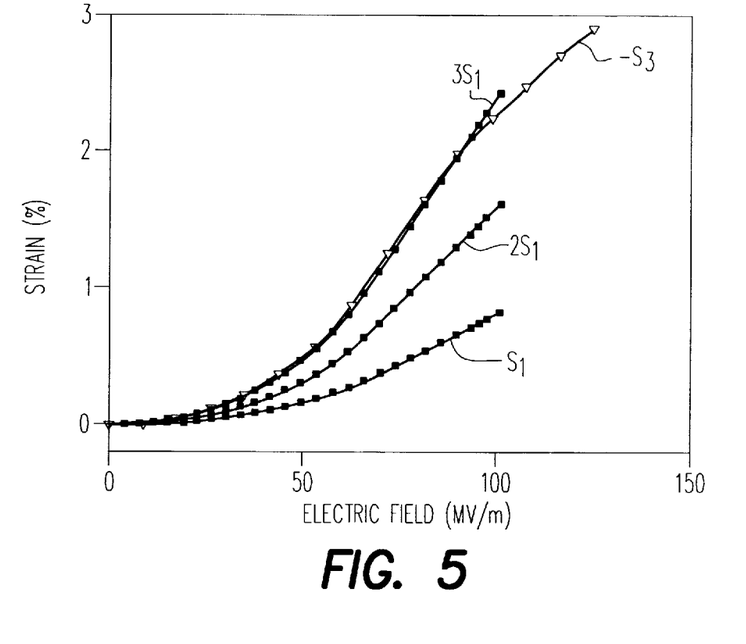
FIG. 5 is a plot of strain versus electric field of P(VDF-TrFE) (65/35 mol %) unstretched films, irradiated at 120 C with 60 Mrad dose showing that the longitudinal strain (S3) is three times higher than transverse strain (S1).
Figure 6:
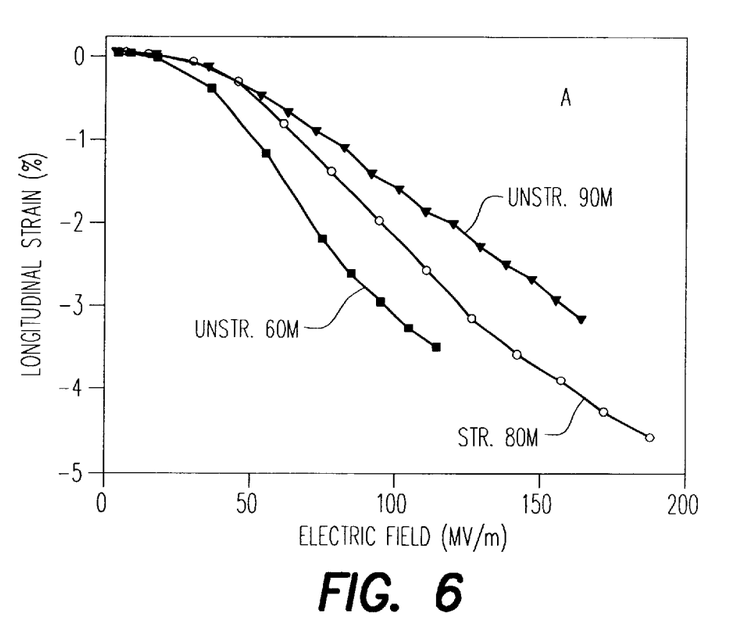
FIG. 6 illustrates plots of strain versus electric field of P(VDF-TrFE) (65/35 mol %) copolymer films, where plot (A) shows longitudinal strain of stretched and unstretched films irradiated at 120 C with different doses.

The effect of irradiation parameters are shown in FIGS. 4 and 5. As is apparent from FIG. 6 for certain samples, the ratio of the strain level to electric field is higher in comparison to others. The other samples for which the ratio of strain to field was higher were selected for piezoelectric coefficient measurements. The maximum measured piezoelectric coefficients were $d_{33}=-350$ pC/N and $d_{31}=260$ pC/N. Those measured values are almost 10 times higher than the values reported for prior art P(VDF-TrFE) copolymers and are almost comparable to the piezoelectric ceramic PZT-5H.

A material with such a high piezoelectric coefficient, a high electrostrictive strain level, with a further ability to control the strain magnitude and direction is an attractive candidate for actuator, transducer and sensor applications. However, many soft polymers can also generate very high strain levels due to the electrostatic effect. Therefore, in addition to the strain level, other parameters such as, the volumetric ($Ysm^2/2$) and gravimetric($Ysm^2/2(\ )$) strain energy densities and blocking force levels should be used in order to evaluate the actuator material's performance.

Table 1 (see FIG. 7a) compares a copolymer prepared in accord with the invention with several currently known materials including the ferroelectric relaxor single crystal PZN-PT, which was discovered recently to possess an ultrahigh strain response. As can be seen, the P(VDF-TrFE) copolymer exhibits the maximum elastic energy density.

Figure 8:
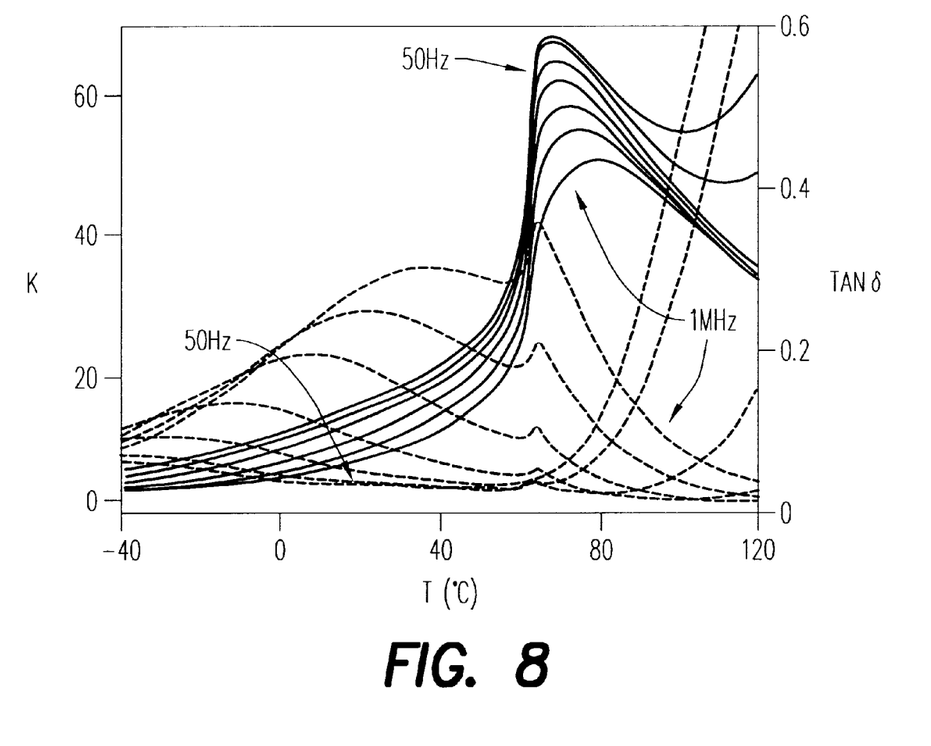
FIG. 8 is a plot of variation of dielectric constant K (solid lines) and dielectric loss Tan δ (dashed lines) (50/50 mol %) versus temperature for unstretched, unirradiated copolymer film at 50 Hz, 100 Hz, 1 KHZ, 0.1 KHz, 0.4 KHz and 1 MHz frequencies.
Figure 9:
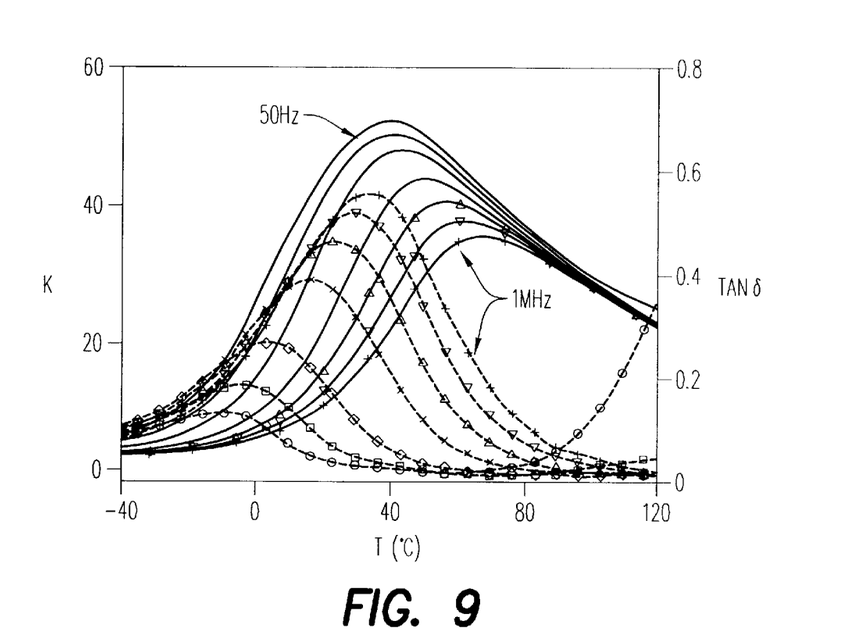
FIG. 9 is a plot of variation of dielectric constant K (solid lines) and dielectric loss Tan δ (dashed lines) as a function of temperature for unstretched P(VDF-TrFE) (50/50 mol %)copolymer films irradiated at 120 C with 40 Mrad dose. The measuring frequencies (from top to bottom for dielectric constant and from bottom to top for dielectric loss) were 50 Hz, 100 Hz, 1 KHZ, 0.1 KHz, 0.4 KHz and 1 MHz.

Dielectric Results:

The dielectric constant of an electrostrictive polymeric material prepared in accord with the invention also shows a remarkable increase at room temperature, after irradiation. FIG. 8 plots variations of dielectric constant K (solid lines) and dielectric loss Tan $\delta 1$ (dashed lines) versus temperature for unstretched, non-irradiated copolymer film at 50 Hz, 100 Hz, 1 KHZ, 0.1 KHz, 0.4 KHz and 1 MHz frequencies. FIG. 9 plots variations of dielectric constant K (solid lines) and dielectric loss Tan $\delta 1$ (dashed lines) as a function of temperature for unstretched P(VDF-TrFE) (50/50 mol %) copolymer films, irradiated at 120 C with 40 Mrad dose. The measuring frequencies (from top to bottom for dielectric constant and from bottom to top for dielectric loss) were 50 Hz, 100 Hz, 1 KHZ, 0.1 KHz, 0.4 KHz and 1 MHz.

Comparing the non-irradiated material (FIG. 8) and the irradiated material (FIG. 9) the dielectric constant of unstretched 50/50 copolymer, at room temperature, for the irradiated film is higher than the non-radiated material. After irradiation, the dielectric transition peak becomes broader and shifts towards lower temperatures.

Figure 10:
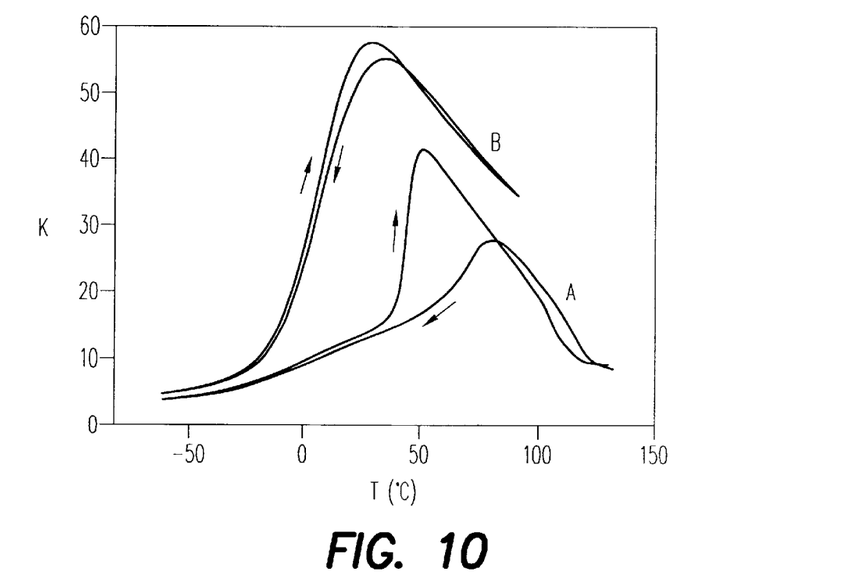
FIG. 10 is a plot of dielectric constant K measured at 1 kHz with respect to temperature for (A) unirradiated and (B) irradiated stretched, P(VDF-TrFE) (65/35 mol %) copolymer films irradiated at 95° C. with 60 Mrad dose, (where the data were taken during sample heating and cooling).

Similar to strain, the dielectric constant also can be adjusted by using different material processing conditions and irradiation parameters. FIG. 10 is a plot of dielectric constant K measured at 1 kHz with respect to temperature for stretched, P(VDF-TrFE) (65/35 mol %) copolymer films (A) unirradiated, (B) irradiated at 95 C with 60 Mrad dose. As can be seen by comparing the dielectric constant for the unirradiated and irradiated stretched P(VDF-TrFE) (65/35 mol %) film, the dielectric constant for the stretched irradiated films is higher than the unirradiated films.

Figure 11:
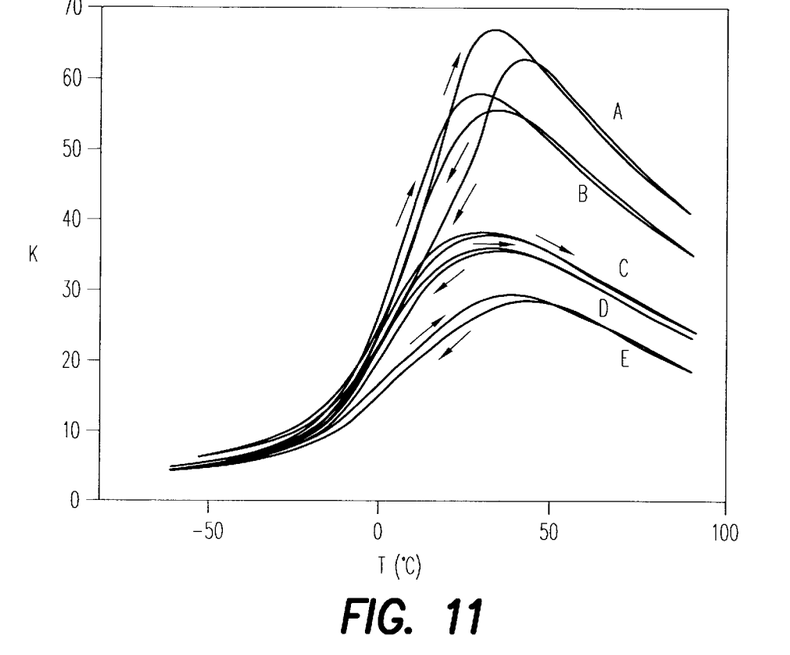
FIG. 11 is a plot of dielectric constant K versus temperature measured at 1 kHz frequency for stretched P(VDF-TrFE) (65/35 mol %) copolymer films irradiated at 95 C with (A) 40, (B) 60, (C) 80, (D) 100, (E) 120 Mrad irradiation doses, (where the data were taken during sample heating and cooling).
Figure 12:
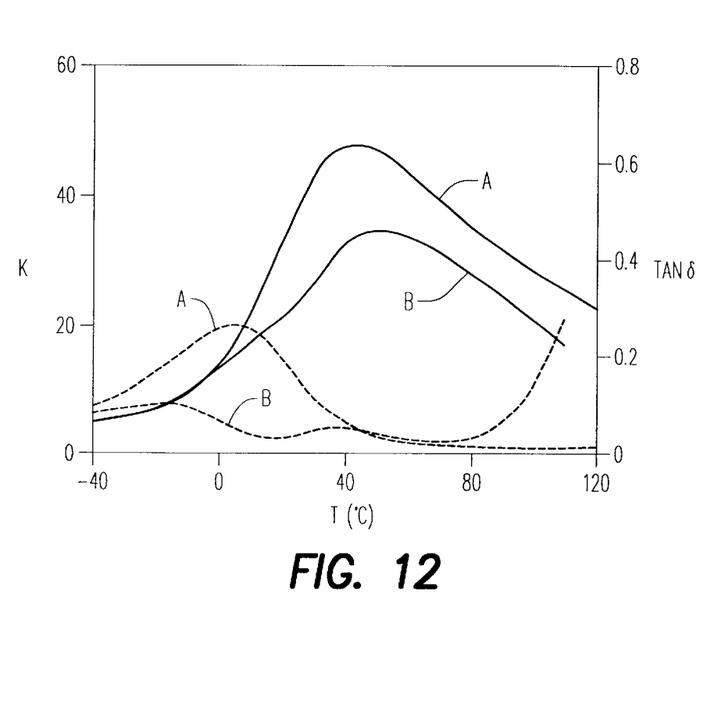
FIG. 12 is a plot of dielectric constant K (solid lines) and dielectric loss Tan ((dashed lines) versus temperature measured at 1 kHz frequency for unstretched P(VDF-TrFE) (50/50 mol %) copolymer films irradiated at (A) 120 C with 40 Mrad dose (B) 25 C with 80 Mrad.

Again by controlling the irradiation parameters, the dielectric constant can be tailored. FIG. 11 shows this effect and illustrates that by increasing the irradiation dose, the dielectric peak becomes broader, there is less hysteresis and the dielectric constant decreases. Further, as shown in FIG. 12, by increasing the irradiation temperature, the irradiation dose can be reduced significantly.

Figure 13:
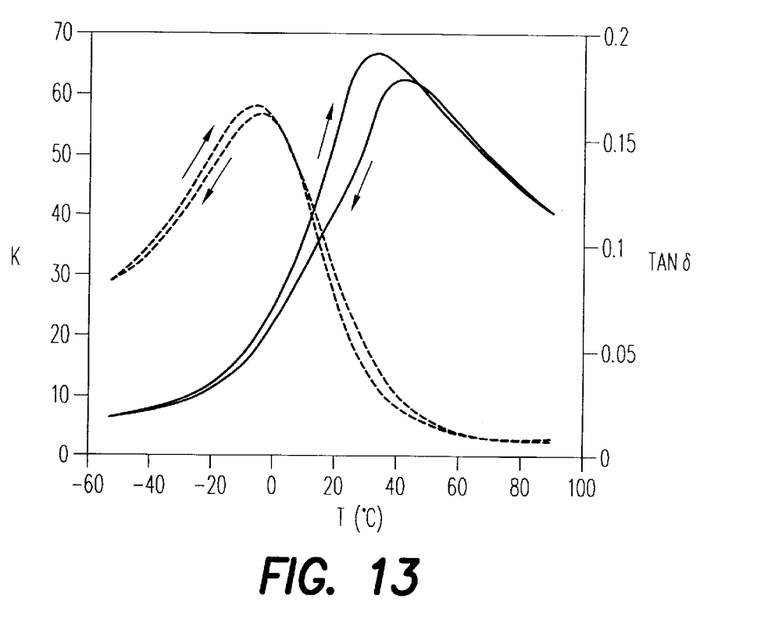
FIG. 13 is a plot of dielectric constant K (solid lines) and dielectric loss Tan ((dashed lines) as a function of temperature at 1 kHz frequency for stretched P(VDF-TrFE) (65/35 mol %) copolymer films irradiated at 95 C with 40 Mrad dose, (where the data were taken during sample heating and cooling).

FIG. 13 illustrates that a maximum dielectric constant of about 67 and a loss in the range of 1–2% was observed at 1 kHz (near room temperature) in 65/35 stretched films irradiated at 95 C for a 40 Mrad dose.

To Applicants' knowledge, a P(VDF-TrFE) copolymer produced in accord with the invention exhibits a highest dielectric constant (with low dielectric loss at room temperature) among known polymer dielectric materials. The same can be expected for other PVDF polymers.

It was found that a field of up to 350 MV/m can be applied to a polymer prepared in accord with the invention without causing breakdown. Accordingly, a capacitor material results with an electric energy density of about 36 J/cm3.

Relaxor Behavior:

Irradiated polymer films prepared in accord with the invention exhibit a relaxor ferroelectric behavior. In comparison to normal ferroelectrics, relaxor ferroelectrics are characterized by the presence of diffuse and rounded maxima in the temperature dependence of their dielectric permittivity, and further exhibit a strong relaxation dispersion for a wide frequency range. In addition, relaxors show a slim polarization hysteresis loop near the dielectric maxima. But, as temperature is reduced from dielectric maxima (Tmax), the hysteresis loop gradually broadens and finally transforms into a regular rectangular loop at a temperature well below Tmax.

Figure 14:
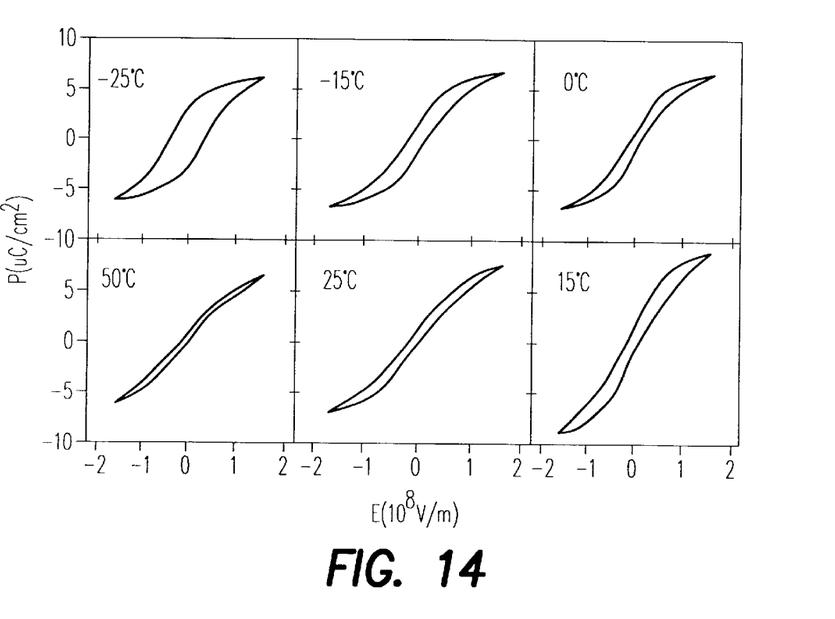
FIG. 14 is a plot of change in polarization hysteresis loops with the noted temperatures for P(VDF-TrFE) (50/50 mol %) copolymer films irradiated at 120 C with 40 Mrad.

It was found that irradiated P(VDF-TrFE) shows a broad dielectric peak which shifts towards higher temperature with increasing frequency (see FIG. 9) and follows the Vogel-Fulcher law, an empirical law which is applicable for a system which undergoes relaxation freezing below certain temperatures. The square-to-slim hysteresis loop is evident in FIG. 14 which plots changes in polarization hysteresis with various temperatures for P(VDF-TrFE) (50/50 mol %) copolymer films irradiated at 120 C with 40 Mrad. As can there be seen, the polarization behavior becomes hysteretic at −25 C, with remnant polarization, $Pr=2.1$ mC/cm², saturation polarization, $Ps=40$ mC/cm² and critical field, $Ec=45.5$ MV/m. However, with increases in temperature, the polarization reduces gradually and shows a slightly a non-linear polarization loop near 50 C i.e. near T max.

These results show that a material made in accord with the invention (i.e., after irradiation) behaves like a relaxor ferroelectric material (rather than a simple paraelectric, as reported earlier). The results obtained from X-ray scans, Raman spectra, DSC and crosslinking measurements show that electron irradiation breaks up the coherent polarization domains in the normal ferroelectric material to a nanoscale polar region, introduces defects randomly by introducing gauche bonds in long trans-planar polymer chains and causes crosslinking in the crystalline region. Due to large difference in the lattice constant between polar and non polar phases in a P(VDF-TrFE) copolymer, a gradual increase in the polarization with field in the electrostrictive copolymer produces a giant electrostrictive strain and strain energy density.

Electroactive polymer materials developed in accord with the invention show: very high strain (4–5%), high elastic energy density (above 0.3 J/cm³ or 160 J/kg), high dielectric constant with relatively low loss at room temperature (>40 at 1 kHz and a loss <5%), a slim polarization hysteresis loop at room temperature, a high piezoelectric response in a DC biased state and high electric energy density (a breakdown field >350 MV/m).

Most importantly, being a polymeric material, their acoustic impedance levels match human tissue and exhibit no mechanical fatigue at high strain levels. Further, their transverse strain $S_1$ can be tuned over a large range with respect to their longitudinal strain $S_3$. $S_1/S_3$ can be tuned from 0.2 to more than 1.1. Accordingly, an electrostrictive relaxor ferroelectric polymer prepared in accord with the invention exhibits improved electrical properties that offer substantial improvements in material characteristics required for capacitor, actuator and transducer applications.

Figure 15:
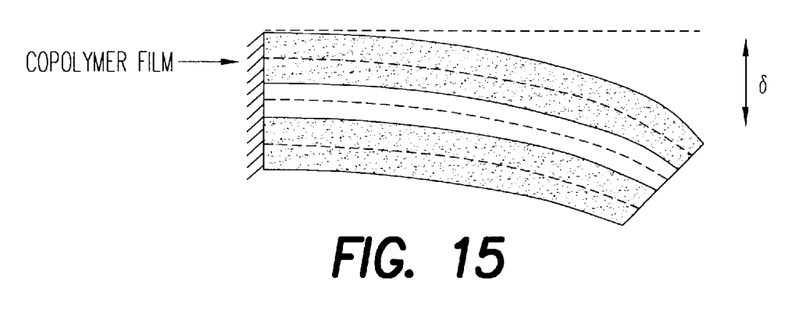
FIG. 15 is a schematic of a bimorph actuator employing a polymer processed in accord with the invention.
Figure 16:
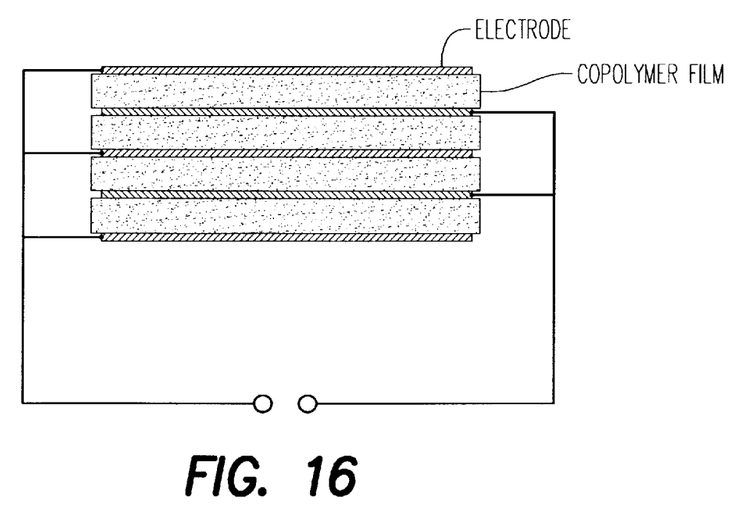
FIG. 16 is a schematic of a multilayer capacitor employing polymer layers processed in accord with the invention.

FIGS. 15 and 16 illustrate examples of a bimorph actuator and a multilayer capacitor, both of which incorporate polymer layers that have been processed in accord with the invention.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. The method of manufacturing a relaxor ferroelectric polymer comprising the steps of:

(a) pressing polyvinylidine fluoride copolymer powder;

(b) annealing the pressed copolymer of step (a); and (c) irradiating the annealed copolymer of step (b) in an oxygen free atmosphere with between about 2.5 MeV to 3 MeV electrons at a temperature in a range from between about 25 to 120 C and at an irradiation dose in a range from between about 30 to 175 Mrad.

2. The method of claim 1, wherein the polyvinylidine fluoride copolymer powder is selected from the group consisting of: polyvinylidine fluoride, polyvinylidine fluoride-trifluoroethylene P(VDF-TrFE), polyvinylidine fluoride tetrafluoroethylene P(VDF-TFE), polyvinylidine fluoride triflurorethylene—hexafluoropropylene P(VDF-TFE-HFE), and polyvinylidine fluoride—hexafluoropropylene P(VDF-HFE).

3. The method of claim 2, wherein the polyvinylidine fluoride copolymer powder is preferably polyvinylidine fluoride-trifluoroethylene P(VDF-TrFE).

4. The method of claim 3, wherein the polyvinylidine fluoride copolymer is a polyvinylidine fluoride-trifluoroethylene of the formula PVDF(x)-TrFE(1-x), wherein x is in the range from between about 50 to 86 mol %.

5. The method of claim 1, wherein said polyvinylidine fluoride copolymer is stretched.

6. The method of claim 1, wherein said step of irradiating introduces defects to polyvinylidine fluoride polymers using beta or gamma rays in the approximate range of between about 500 KeV to 3 MeV in an oxygen free atmosphere, thereby enabling crosslinking to occur.

* * * * *